United States Patent
Connolly et al.

(10) Patent No.: US 6,757,313 B1
(45) Date of Patent: Jun. 29, 2004

(54) CONTROL OF CURRENT SPREADING IN SEMICONDUCTOR LASER DIODES

(75) Inventors: John C. Connolly, Clarksburg, NJ (US); Louis A. Dimarco, Hamilton Square, NJ (US)

(73) Assignee: Trumpf Photonics Inc., Cranbury, NJ (US)

( * ) Notice: Subject to any disclaimer, the term of this patent is extended or adjusted under 35 U.S.C. 154(b) by 0 days.

(21) Appl. No.: 09/710,362

(22) Filed: Nov. 10, 2000

Related U.S. Application Data
(60) Provisional application No. 60/164,864, filed on Nov. 12, 1999.

(51) Int. Cl.$^7$ .............................................. H01S 5/00
(52) U.S. Cl. ........................................ 372/46; 372/45
(58) Field of Search ..................................... 372/45–46

(56) References Cited

U.S. PATENT DOCUMENTS

| | | | | |
|---|---|---|---|---|
| 5,469,457 A | * | 11/1995 | Nagai et al. | 372/45 |
| 5,502,741 A | * | 3/1996 | Carroll et al. | 372/96 |
| 5,511,088 A | * | 4/1996 | Loualiche et al. | 372/45 |
| 5,696,784 A | | 12/1997 | Srinivasan et al. | |
| 5,717,707 A | | 2/1998 | Beernink et al. | |
| 5,757,837 A | * | 5/1998 | Lim et al. | 372/45 |
| 5,778,018 A | * | 7/1998 | Yoshikawa et al. | 372/45 |
| 5,920,586 A | * | 7/1999 | Nagai | 372/46 |
| 5,936,994 A | * | 8/1999 | Hong et al. | 372/46 |
| 5,956,359 A | * | 9/1999 | Adams et al. | 372/45 |
| 5,960,020 A | * | 9/1999 | Nagai | 372/46 |
| 5,982,531 A | * | 11/1999 | Emery et al. | 372/43 |
| 5,987,047 A | * | 11/1999 | Valster et al. | 372/45 |
| 6,044,098 A | * | 3/2000 | Sun | 372/46 |
| 6,055,258 A | * | 4/2000 | Beyea et al. | 372/46 |
| 6,064,683 A | | 5/2000 | Johnson | |
| 6,075,802 A | * | 6/2000 | Stolz et al. | 372/46 |
| 6,165,811 A | | 12/2000 | Lee et al. | |
| 6,195,380 B1 | * | 2/2001 | Shih et al. | 372/46 |
| 6,256,330 B1 | * | 7/2001 | LaComb | 372/46 |
| 6,278,720 B1 | | 8/2001 | Lee et al. | |
| 6,314,122 B1 | * | 11/2001 | Peale | 372/45 |
| 6,406,932 B2 | | 6/2002 | Lee et al. | |

* cited by examiner

*Primary Examiner*—Paul Ip
*Assistant Examiner*—James Menefee
(74) *Attorney, Agent, or Firm*—Fish & Richardson P.C.

(57) ABSTRACT

A semiconductor laser diode and method are described, wherein the path of the current through the device between the positive and negative conductors is controlled. Lateral spread of the gain current in the active region is prevented by implanting protons in areas of the active layer flanking a desired gain region. The implanted regions become less conductive, and prevent lateral spread of the gain current. The position of the implanted regions can be selected so that the gain current only crosses a portion of the active layer that supports desired lateral modes of the laser light.

9 Claims, 4 Drawing Sheets

CONTROL OF CURRENT SPREADING IN SEMICONDUCTOR LASER DIODES

BACKGROUND OF THE INVENTION

This application claims the benefit of U.S. Provisional Application No. 60/164,864, filed Nov. 12, 1999. The present invention relates to controlling the lateral extent of a region of a semiconductor laser diode that is exposed to a gain current, and specifically to controlling such lateral extent in a ridge waveguide semiconductor laser diode adapted to support selected lateral modes of the emitted laser light.

SUMMARY OF THE RELATED ART

Typical semiconductor lasers such as laser diodes are formed by a body of semiconductor material having a thin, active region formed between cladding layers and contact regions of opposite polarity. A waveguide is formed in the structure by defining a stripe for light guiding and for current injection. Light is generated in the active region when the stripe region is subject to a current flow between the positive and negative contact regions. Cladding and confinement regions, among others, are placed between the contacts and the active region for guiding and confining the light along the thickness of the layers. The various regions typically are formed as substantially parallel thin layers grown epitaxially. When the current is greater than the threshold current for the active waveguide, amplified light is generated. In general, the greater the current flowing into the active waveguide, the more light is generated.

The active regions can be shaped like a thin layer having a specified thickness, length and width. The oscillation of the electric and magnetic fields of the light waves are restricted to specific modes, depending on the dimensions of the active layer. The longitudinal mode of the light, along the direction of propagation, is determined by the longitudinal length of the active layer forming the laser cavity. Similarly, the thickness of the active layer restricts oscillation of the light waves in the transverse direction, perpendicular to the plane of the layers along which light propagates. By appropriately sizing the thickness of the layer, oscillations can be restricted to the fundamental mode or to other desired modes of the light.

However, in the lateral direction perpendicular to the length of the cavity and in the same plane as the layers, the modes are not limited by the size of the active layer, but rather by the width of the stripe and of the current flow region. More than one mode can thus co-exist simultaneously within the active layer.

One problem encountered in this type of semiconductor laser diode is that the light emitted may include more than one optical mode in the lateral direction, as described above. The multi mode light emitted from this type of diode is thus of limited use, because it is formed by a complex pattern of bright and dark areas. Many applications require laser light that has a far field pattern consisting of a single bright spot, made, for example, by light that includes only the fundamental mode. For other uses, a different specific pattern can be required, such as one that is achieved by generating light having various selected modes.

A conventional method used to control the lateral modes of the light includes forming a positive conductor on top of the semiconductor layer, having a lateral dimension selected to only support the desired modes. An insulator can be placed between the active layer and the positive conductor layer outside of that lateral dimension, to prevent current flowing from the positive conductor outside of the selected region.

This method works for low power applications, but when the gain current flowing from the positive to the negative conductor and across the active layer exceeds a certain value, the current tends to spread in the lateral direction as it travels perpendicular to the layers. The degree of lateral current spreading can also increase with increased gain or drive current levels. This forms areas of high gain in the active layer that are larger than what is necessary to support the selected modes. When this occurs, extraneous modes can be supported by these enlarged gain areas of the active layer, and the light emitted is no longer of only the desired mode.

Accordingly, there is a need for a device and a method for controlling the lateral spread of current through an active layer of a semiconductor laser diode, so that the gain regions of the active layer can be limited in the lateral direction to only support desired lateral modes of the generated laser light, and in particular to support only the fundamental mode of the laser light.

SUMMARY OF THE INVENTION

The present invention is directed to a semiconductor laser diode and a related method that is adapted to control the lateral modes of the laser light generated, so that only desired modes are supported. In particular, this result is achieved by controlling the lateral spread of the electric current that passes through the active layer, so that only a selected portion of the active layer has a high gain, resulting in amplification of only the light crossing that portion of the layer. The other portions of the active layer that flank the selected active region inhibit the flow of current, and therefore have a lower gain which results in less amplification, or no amplification of the light passing through those portions. The lateral dimensions of the high gain portion of the active layer can be selected to support only desired modes of the laser light, such as the fundamental mode or a combination of the fundamental and other modes.

The lateral control of the electric current is achieved by implanting high energy ions, such as protons, in the portions of the active layer that require a reduced conductivity, while shielding from the ion implant the portion of the active layer where high conductivity, therefore high gain is desired. This shielding can be obtained, for example, by placing a photoresist layer between the source of ions and the active layer. The photoresist layer can be shaped with openings that correspond to the size of the desired conductive portion of the active layer.

To achieve these and other advantages and in accordance with the purpose of the invention as embodied and broadly described, in one aspect the invention is a ridge waveguide semiconductor laser diode adapted to support desired lateral modes of generated light, comprising a first conductor layer for application of a current, a second conductor layer facing the first conductor layer, an active layer disposed between the first and second conductor layers, a conduction region of the active layer adapted for conducting the current, and reduced conductivity regions of the active layer, flanking the conduction region, adapted to impede passage of the current.

BRIEF DESCRIPTION OF THE DRAWINGS

The accompanying drawings are included to provide a further understanding of the invention, are incorporated in and constitute a part of the specification, illustrate embodiments of the invention and, together with the description, serve to explain the objects, advantages and principles of the invention.

In the drawings.

DETAILED DESCRIPTION OF THE PREFERRED EMBODIMENTS OF THE INVENTION

Semiconductor laser diodes are used in a variety of devices such as optical data storage and compact disc drives, for printing processes such as those used in laser printers, and also for displays. For certain applications, a plurality of laser diodes can be assembled in an array, so that the light from all of the arrayed laser diodes has the same mode and in some cases also the same phase.

For high brightness applications, a gain current up to 20 or 30 times the threshold current of the active layer in the laser diodes can be used to obtain a high brightness spot or beam from the semiconductor material.

Figure 1:
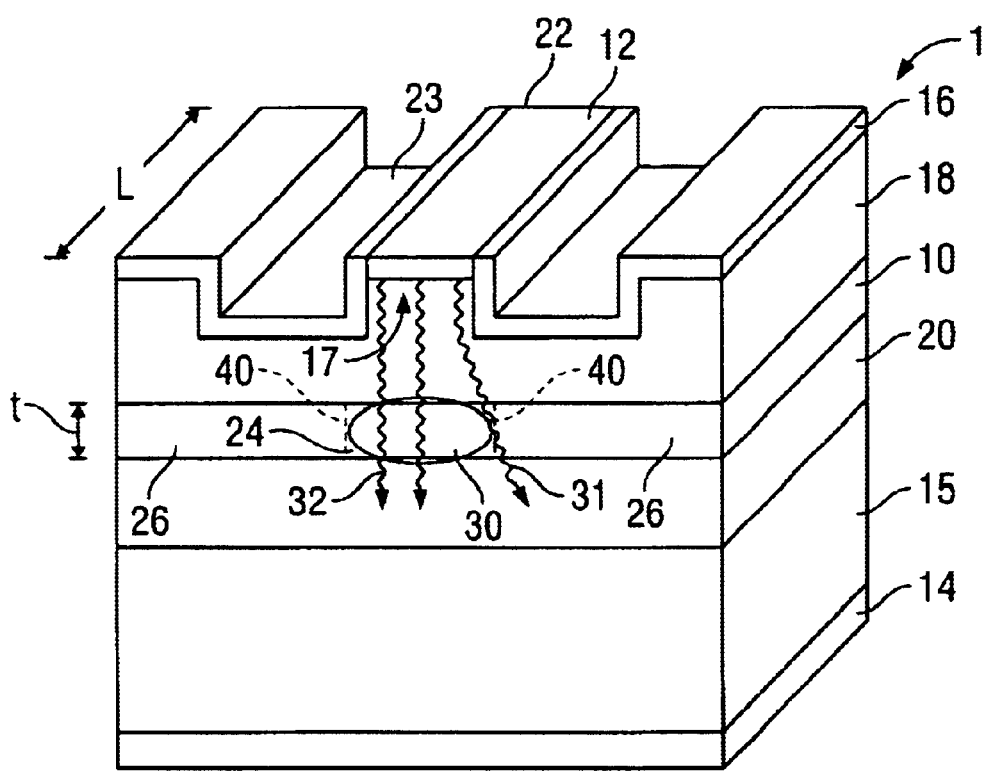
FIG. 1 is a schematic perspective view of one embodiment of a semiconductor laser diode incorporating the present invention.

FIG. 1 shows one embodiment of a semiconductor laser diode according to the present invention. Semiconductor lasers consist of epitaxial layers grown on a single-crystal substrate 15. Typically, the substrate 15 is n-type. The exemplary semiconductor laser diode 1 has an active layer 10 that can include a quantum well structure. Active layer 10 can be formed, for example, of un-doped InGaAs or InGaAsP. A positive conductor 12 can be applied facing one surface of the active layer 10, and several p-type clad region layers and confinement layers can also be deposited in region 18, between the active layer 10 and the positive conductor 12, according to a conventional manner of construction of semiconductor laser devices. A negative conductor layer 14 can be formed on the substrate 15, facing the opposite surface of active layer 10. A conventional arrangement of confinement layers and n-type clad layers can also be disposed in region 20, between the active layer 10 and the substrate 15.

Positive conductor layer 12 can be a strip as shown in FIG. 1, or can extend the entire width of semiconductor laser diode 1. The strip shaped positive conductor layer 12 can preferably have dimensions corresponding to a region of active layer 10 that supports the desired optical modes. A dielectric insulator layer 16 can be used to prevent the flow of current from entering the top layers of region 18, outside of a selected lateral area. Insulator layer 16 thus defines an opening 17 in the insulator layer, that corresponds to the area where positive conductor 12 is in contact with region 18. In this manner, the current flowing from positive conductor 12 to negative conductor 14 is allowed to enter the portion of region 18 under opening 17, but is prevented from entering the remainder of region 18 by insulator layer 16. In a different embodiment, insulator 16 can be omitted from the device, particularly if positive conductor 12 is shaped as a strip of desired width, and does not extend the entire width of semiconductor laser diode 1.

The construction of semiconductor laser diode 1 can also include a ridged waveguide 22 extending parallel to a longitudinal axis of semiconductor laser device 1, and extending along the entire length L of the device. For example, ridge waveguide 22 can have a width of about 3–5 microns. Ridge waveguide 22 channels the light being emitted and amplified in active layer 10, so that the light is directed for the most part along the longitudinal dimension of the semiconductor laser device 1.

In the lateral direction, along the active layer 10, the extent of the laser light is governed by the width of the waveguide, the lateral index step between the waveguide and the region external to it, and the amount of lateral current spread. In the case of a ridge waveguide, the lateral index step is the index difference between the region under the ridge 22, and the regions under the channels 23 on each side of the ridge 22.

If the index step is not present, the waveguide is "gain guided". In this case, the light is guided along the current path by virtue of the absorption difference, or gain vs. loss ratio, between the current flow region and its lateral regions. When the index step is present, the waveguide is "index guided", so that guiding of the light is achieved by the index step. Index guiding can be more advantageous than gain guiding, because it results in single-spatial mode operation and reduced astigmatism.

At low power settings, only a small portion of the active layer 10, approximately corresponding to the width of the non-insulated region of positive conductor layer 12, is crossed by the current. At high power settings, when the current flowing from positive conductor 12 to negative conductor 14 is relatively large, the combination of a stripe-like positive conductor 12 and an insulator 16 is insufficient to maintain the flow of current only within the general dimension of opening 17. Instead, the current tends to spread laterally outward to a region of active layer 10 having greater width than the opening 17. The current thus no longer follows a straight line from positive conductor 12 to negative conductor 14, but instead flares laterally outwards, as schematically shown by the dashed line 31 in FIG. 1. This broadens the effective width of the gain region generating light, and allows the waveguide to support additional lateral modes.

To prevent the occurrence of unwanted modes, active layer 10 is divided in a defined gain region 24 of high conductivity, through which the current flowing from positive conductor element 12 to negative conductor element 14 can easily pass, and flanking regions 26 of reduced conductivity, through which the current cannot easily pass. In this manner, the current flowing from positive conductor element 12 to negative element 14 is prevented from spreading laterally away from defined gain region 24, and follows a path shown by the solid line 32. The lateral dimension of the high gain portion of active layer 10 is thus limited to the size of defined gain region 24. By properly sizing the defined gain region 24, only the desired lateral modes of the laser light can be sustained, while other modes are not amplified and will decay.

For example, defined gain region 24 could be sized to only support the fundamental mode of the laser light in active layer 10, so that a sharp, single spot output laser beam can be generated by the device. Generation of laser light of the fundamental mode is useful for lasers used in telecommunications. For other applications, different modes can be useful. For example, a non-gaussian beam formed by the fundamental and the second transverse mode can be useful in laser printing applications to improve printing sharpness.

The reduced conductivity regions 26 formed in the active layer 10 can be obtained, for example, by implanting ions such as protons in the material of active layer 10. The proton implant damages the structure of the active layer 10, and causes the affected region of active layer 10 to become non-conducting. The extent of the transformation incurred by active layer 10 is dependent on the strength and the duration of the proton implant. For example, successful results can be obtained by implanting protons having an energy of between approximately 130 KeV and 170 KeV. The implant can preferably have a duration of between about 1 and 5 minutes, and can be repeated more than once.

As shown in FIG. 1, the laser light is amplified within a light amplification portion 30 of defined gain region 24. The actual shape of light amplification portion 30 depends on the desired mode being sustained. For example, in the case shown, the fundamental mode is supported, which results in a light amplification portion 30 shaped like a single elliptical spot through active layer 10, where the light amplification takes place.

The location within active layer 10 of reduced conductivity regions 26 must be selected carefully. The width of the defined gain region 24 of active layer 10 determines which lateral modes of the laser light will be supported, therefore reduced conductivity regions 26 must be placed sufficiently close to light amplification portion 30 of active layer 10, so that additional modes will not be sustained by the active layer 10.

To satisfy these requirements, interface 40 between defined gain region 24 and reduced conductivity regions 26 must be selected to be just outside light amplification portion 30 of active layer 10. At the same time, interface 40 must not be so far from light amplification portion 30 that the defined gain region 24 can support modes other than the desired mode of the laser light.

Figure 2:
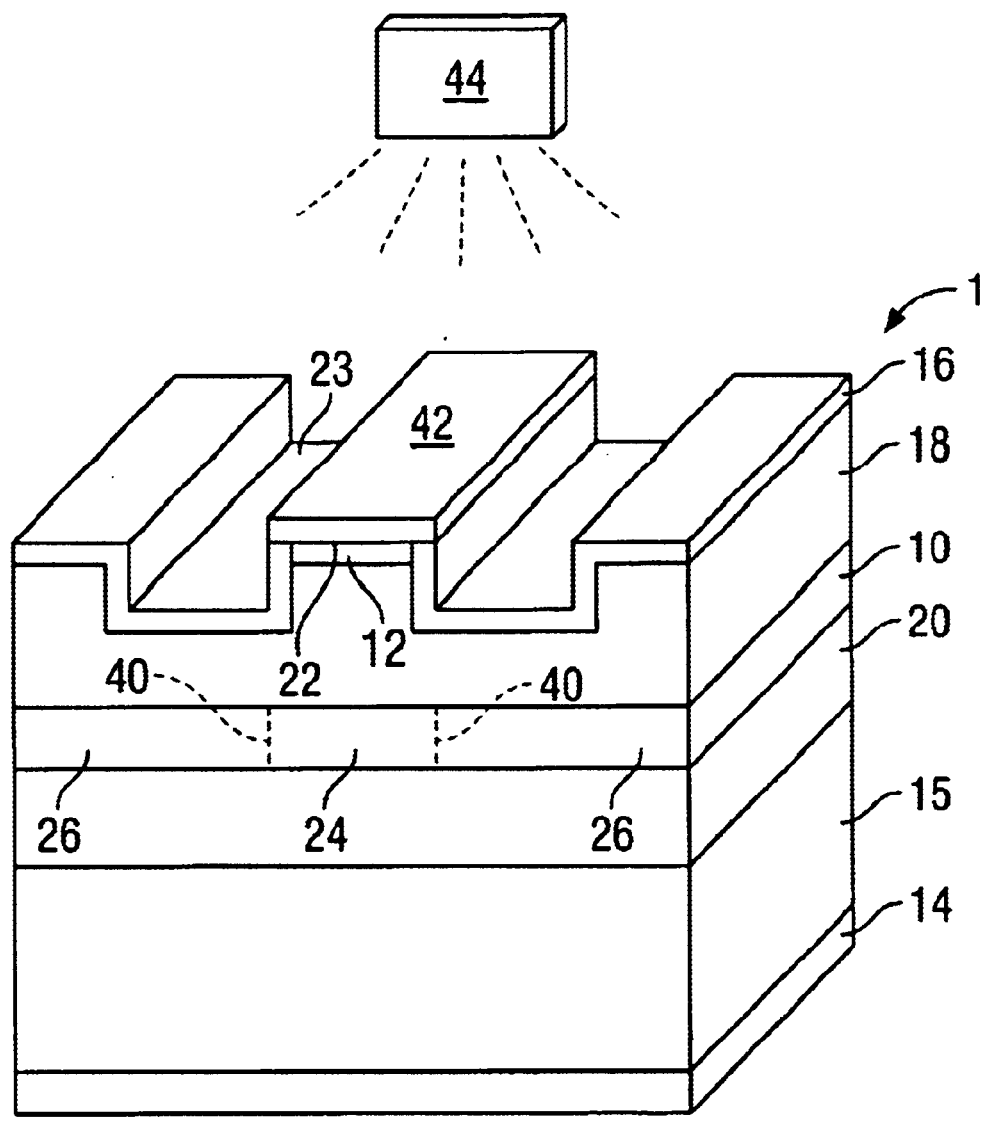
FIG. 2 is a schematic perspective view of the semiconductor laser diode shown in FIG. 1, also including a barrier layer.

The manufacturing process for semiconductor laser diode 1 will be described with reference to FIG. 2. Positive and negative conductor layers 12 and 14, insulating layer 16, active layer 10 and the remaining layers forming semiconductor laser diode 1 are grown in a conventional manner. In a preferred embodiment of the device according to the present invention, reduced conductivity areas 26 are formed by implanting protons in the layers of the device. A source of protons 44 can be, for example, hydrogen.

A barrier layer such as photoresist layer 42 is used to shield from the protons areas of active layer 10 that are to remain conductive. For example, photoresist layer 42 can be placed above defined gain region 24, so that protons generated by source 44 are stopped by photoresist layer 42, and do not affect defined gain region 24. The remaining portions of the device, above and including the reduced conductivity regions 26, are implanted with protons, resulting in a loss of conductivity for those regions. In an embodiment according to the invention, only sections lying below the channels 23 on the sides of the ridge 22 are implanted. The depth of the implant can correspond approximately to the thickness of clad region 18 and can reach through active layer 10.

Figure 3:
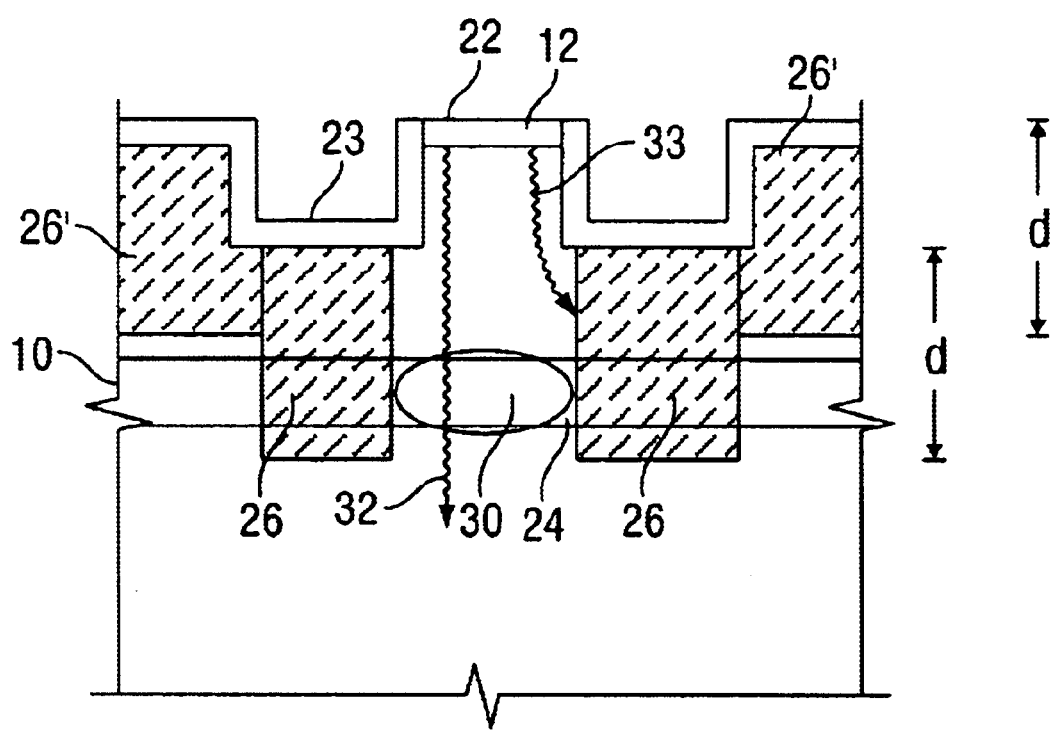
FIG. 3 is a schematic front elevation view showing a detail of the embodiment of FIG. 1.

FIG. 3 shows a detail of a region of the semiconductor laser depicted in FIG. 1. This exemplary embodiment includes an implant region of constant depth 'd' obtained, for example, with an implant of given energy and duration. Because of the presence of channels 23 on the sides of ridge 22, the implant depth 'd' reaches active layer 10 in regions 26, below channels 23. Regions 26', located beyond channels 23, also receive an implant of depth 'd'. However, the layers of the laser diode above the active layer 10 have greater thickness at that point, and thus the implant in region 26' may not reach the active layer 10.

FIG. 3 also shows lines 32 that indicate the path of current traveling through active layer 10 from positive conductor 12, and lines 33 indicating the path of spreading current blocked by reduced conductivity areas 26.

Protons from source 44 can travel across metallic layers and the various layers that form semiconductor laser diode 1, so that the proton implant can take place in a single step process, after all the layers of the wafer have been grown in a conventional manner. Photoresist layer 42 can be made, for example, of a long chain polymer such as SHIPLEY Photoresist Type AZ 4620, having a thickness of about 5 µm to 7 µm. However, other materials that absorb protons from source 44 can be used in photoresist layer 42.

Since the energy of the implant determines the amount of loss occurring in the implanted layer, the loss in selected regions of the active layer 10 can be controlled with the location and energy of the implant. In this manner, the waveguide loss in the lateral direction can be selected by modifying the location of the implant. This loss introduced by the implant is another mechanism that can be used to control the laser light mode in the waveguide, in addition to controlling the current spread in reduced conductivity areas 26.

In a preferred embodiment, photoresist layer 42 can be placed above the outer surface of conductor layer 12, and can be removed after the implant has been performed. However, other configurations of photoresist layer 42 can be utilized, as long as photoresist layer 42 is placed between the source of protons 44 and the areas that are to remain conductive after the implant.

Figure 4:
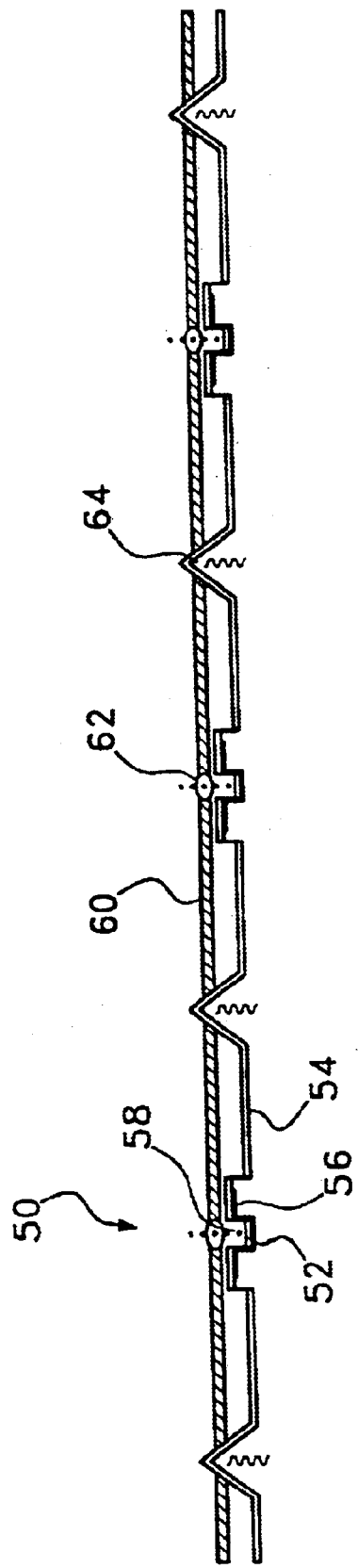
FIG. 4 is a schematic view showing individual semiconductor laser elements disposed in an array.

The semiconductor laser diode according to the invention is well suited for use in an array of laser diodes. For example, FIG. 4 shows an exemplary array of individually-addressable laser elements 50. Each element 50 includes a ridge single-mode waveguide element 52, shown upside down in the figure. In an exemplary embodiment, a dielectric layer 54 and a p-side metallization layer 56 are formed with an appropriate shape and thickness to define the ridges 58. The elements 50 are thermally and electrically separated by V-grooves 64, etched through the active region 60. In an exemplary embodiment, the element 50 are separated by approximately 50 µm, resulting in an array that contains more than 200 laser elements, with a density of 50 elements per cm. All the laser elements in the exemplary embodiment produce a spot of laser light 62 in active layer 60 having the same mode characteristics.

It will be apparent to those skilled in the art that various modifications and variations can be made in the structure and the methodology of the present invention, without departing from the spirit or scope of the invention. Thus, the present invention is intended to encompass the modifications and variations that come within the scope of the appended claims and their equivalents.

What is claimed is:

1. A ridge waveguide semiconductor laser diode adapted to support a fundamental lateral mode of generated light, comprising:
   a first cladding layer having a ridge with a first width at a bottom of the ridge;
   a second cladding layer;
   an active layer disposed between the first and second cladding layers;
   a first conductor layer disposed on top of the ridge for application of current to the laser;
   a defined gain region within the active layer adapted for conducting the current, wherein the defined gain region has a second width greater than the first width;

ion-implanted reduced conductivity regions within the active layer, flanking the defined gain region; and a second conductor layer for conducting current from the first conductor layer through the active layer, wherein the second width is selected such that the defined gain region supports a fundamental lateral mode of the light, while higher order modes are not supported due to their overlap with the reduced conductivity regions.

2. The semiconductor laser diode according to claim 1, further comprising at least one quantum well layer formed within the active layer.

3. The semiconductor laser diode according to claim 1, wherein the defined gain region has a first loss to generated light and the reduced conductivity regions have a second loss to generated light greater than the first loss.

4. The semiconductor laser diode according to claim 1, wherein the second width is selected such that the reduced conductivity regions flanking the defined gain region introduce significant loss to generated light in a higher-order mode, but do not introduce significant loss to generated light in a fundamental mode.

5. The semiconductor laser diode according to claim 1, wherein the active layer is formed of a least one of GaAs, InGaAs, AlInGaAs and InGaAsP.

6. The semiconductor laser diode according to claim 1, wherein the reduced conductivity regions are implanted with protons of energy between about 130 KeV and 170 KeV.

7. The semiconductor laser diode according to claim 1, wherein the reduced conductivity regions have a first index of refraction and the defined gain region has a second index of refraction greater than the first index of refraction.

8. The semiconductor laser diode according to claim 1, further comprising an insulator layer disposed adjacent the first conductor layer.

9. The semiconductor laser diode according to claim 1, wherein the first width is about 3 to 5 microns.

* * * * *